United States Patent

Selvamanickam et al.

[19]

[11] Patent Number: 5,846,912
[45] Date of Patent: Dec. 8, 1998

[54] METHOD FOR PREPARATION OF TEXTURED $YBA_2CU_3O_X$ SUPERCONDUCTOR

[75] Inventors: Venkat Selvamanickam, Guilderland, N.Y.; Amit Goyal; Donald M. Kroeger, both of Knoxville, Tenn.

[73] Assignee: Lockheed Martin Energy Systems, Inc., Oak Ridge, Tenn.

[21] Appl. No.: 583,174

[22] Filed: Jan. 4, 1996

[51] Int. Cl.[6] ............................. C04B 35/053; H01B 12/00
[52] U.S. Cl. ......................... 505/450; 252/521; 505/500; 505/733; 505/780; 423/21.1; 423/604; 423/636
[58] Field of Search ........................... 252/521; 505/450, 505/500, 733, 780; 423/21.1, 604, 636

[56] References Cited

U.S. PATENT DOCUMENTS

| | | | |
|---|---|---|---|
| 4,956,336 | 9/1990 | Salama et al. | 505/1 |
| 4,994,437 | 2/1991 | Torii et al. | 505/1 |
| 5,106,829 | 4/1992 | Quadri et al. | 505/1 |
| 5,149,683 | 9/1992 | Wada et al. | 505/1 |
| 5,244,868 | 9/1993 | Jin et al. | 505/1 |
| 5,300,483 | 4/1994 | Sinha | 505/510 |
| 5,306,700 | 4/1994 | Hojaji | 505/450 |
| 5,527,765 | 6/1996 | Hodge et al. | 505/236 |

OTHER PUBLICATIONS

"A New Process with the Promise of High J. in Oxide Superconductors" by Murakami et al. Japanese Journal of Applied Physics, vol. 28, No. 7, Jul. 1989, pp. 1189–1194.
*Abstracts* MATU 18.02.88 "Mfg. superconducting oxide contg. etc." Derwent Publications Ltd. 1989.
CHCC 18.02.88 "Yttrium–barium–copper–oxygen system oxide etc" Derwent Publications Ltd. 1989.
Niha 26.06.87 "Superconducting oxide" Derwent Publications Ltd. 1989.
NICF 20.08.87 "Superconducting materials prodn. by rapid quenching etc." Derwent Publications Ltd. 1989.

*Primary Examiner*—Paul Lieberman
*Assistant Examiner*—M. Kopec
*Attorney, Agent, or Firm*—Edward A. Pennington

[57] ABSTRACT

The present invention relate to textured $YBa_2Cu_3O_x$ (Y-123) superconductors and a process of preparing them by directional recrystallization of compacts fabricated from quenched YBCO powders at temperatures about 100° C. below the peritectic temperature to provide a superconductor where more than 75% of the $YBa_2Cu_3O_x$ phase is obtained without any $Y_2BaCuO_5$.

19 Claims, 5 Drawing Sheets

# METHOD FOR PREPARATION OF TEXTURED $YBA_2CU_3O_x$ SUPERCONDUCTOR

FIELD OF THE INVENTION

The present invention relates to the preparation of textured $YBa_2Cu_3O_x$ (Y-123) superconductors at temperatures about 100° C. below the peritectic temperature. Specifically, the textured superconductors of the present invention are obtained by directional recrystallization of compacts fabricated from splat quenched YBCO powders. As a result of the lower recrystallization temperatures, more than 75% of the $YBa_2Cu_3O_x$ phase is obtained without the formation of any $Y_2BaCuO_5$.

BACKGROUND OF THE INVENTION

One of the main potential applications of high temperature superconductors is their use as high current conductors that can operate at liquid nitrogen temperatures. The superconductors must be capable of operating at these higher temperatures and high currents over long lengths in moderate magnetic fields. The fabrication technique, to be practically viable, must permit production of the superconductors at high rates. Presently, only the bismuth-based Bi—Sr—Ca—Cu—O 2212 and 2223 superconductors fabricated by the powder-in-tube method appear to satisfy these requirements. However, the poor flux pinning properties of the 2212 and 2223 materials at 77° K limit their use in liquid nitrogen environments.

A high temperature superconductor, such as Y—Ba—Cu—O Y-123, has strong flux pinning properties at 77° K. The preparation of Y—Ba—Cu—O (YBCO) superconductors is taught in U.S. Pat. Nos. 4,956,336 to Salama et al., 4,994,437 to Torii et al., 5,106,829 to Quadri et al., 5,149,683 to Wada et al., 5,244,868 to Jin et al., 5,300,483 to Sinha, 5,306,700 to Hojaji, and Japanese documents JP 1-212217 to Matsushita, JP 1-212221 to Chisso Corp. and JP 64-52611 to Nippon Cement KK.

In the Torii '437 patent, $YBa_2Cu_3O_{7-x}$ is formed from $Y_2BaCuO_5$. In Japanese patent '217, yttrium, barium and copper oxide powders are mixed and calcinated at temperatures of between 750° C. and 950° C. to produce a powder, which is then sintered at temperatures of between 850° C. and 1000° C.

The Quadri et al. '829 patent relates to a method for producing Y-123 superconductors comprising calcining mixes of particle powders at about 900°–950° C., forming the powders into shapes, sintering the shapes at 900°–950° C. and then cooling the shapes for a time sufficient to form a single phase superconductor with a $T_c$ greater than 85° K.

The Jin et al. '868 patent relates to $YBa_2Cu_3O_7$ superconductors. In Example 1, a quantity of previously prepared Y-123 powder is mixed with sufficient CuO powder and pressed into pellets, which were heated in air to 810° C. After cooling, the material had a superconducting temperature of 75° K.

The Hojaji '700 patent relates to a method of making superconducting articles comprising heating mixed oxide precursors until melted, then quenching the molten phase, grinding the first phase to a powder, forming the powder into a shape, heating the shape to an elevated firing temperature and then cooling the shape. The specific method for producing Y—Ba—Cu—O superconductors, indicates that the shaped article has to be fired at a maximum firing temperature of 1000°–1300° C.

Existing melt-texture d YBCO superconductors have been demonstrated to sustain current densities in the order of $10^4$ $A/cm^2$ at 77° K in magnetic fields of a few Tesla over a length of about a centimeter. However, the feasibility of the prior art processes to fabricate long-length conductors is remote because of the ultra-low growth rates required to obtain the conductors. Such low rates are necessary because the mechanism of growth is limited by: (1) the rate of dissolution of Y ions from the $Y_2BaCuO_5$ material (Y-211) into the liquid; and (2) the rate of transport of these ions through the liquid to the solidification interface. Any increase in the growth rate has to involve refinement of the Y-211 particles, which is constrained by the Y-211 particles coarsening at the high temperatures that are typically used in melt processing. Recrystallization at peritectic and higher temperatures results in rapid formation of fine $Y_2BaCuO_5$ (Y-211) precipitates in addition to $YBa_2Cu_3O_x$.

Superconductors are also prepared by other melt-processing techniques. These techniques include laser zone melting and laser float zone levelling where the $YBa_2Cu_3O_x$ phase is directly solidified from the liquid. Other methods, such as partially aligned melt processing, melt infiltration in $Y_2BaCuO_5$, and partial melting of solution-spun filaments have also been developed in an effort to enhance growth rates. However, with the exception of the partial melting of filament technique, none of the above methods provide acceptable sample fabrication with reasonable transport current properties.

A problem in preparation of the Y-123 superconductor is that it is made by a crystal growth process called Thermal Gradient Melt Processing. Essentially, a single crystal is grown which is an inherently slow process involving a peritectic reaction in which the superconducting phase forms a liquid deficient in yttrium.

Other techniques for preparing textured YBCO superconductors are also known. For example, magnetically texturing YBCO, though not affected by slow growth rate problems, produces a material where the current density is limited by weak-link characteristics of the grain boundaries which result in a magnetic field dependence of $J_c$ that is significantly inferior compared to that of melt textured materials. Plastic extrusion can also be used to fabricate long-length YBCO wires at rapid rates and have current densities as high as 1500 $A/cm^2$ over lengths of 1.4 m in the extruded wires. Unfortunately, magnetic field dependence of the extruded wire is as unacceptable as that of sintered materials, with the $J_c$ decreasing by a factor of 50 in a field of 100 G.

Thus, for YBCO superconductors to compete with the other superconductors for conductor applications, a need exists for a processing method that overcomes these drawbacks and disadvantages. The problems and drawbacks of prior art techniques have been overcome by the subject invention described below and in the accompanying drawings.

SUMMARY OF THE INVENTION

The present invention provides a process for preparing a YBCO (Y-123) superconductor without the prior requisite formation of a $Y_2BaCuO_5$ (Y-211) phase by heating calcined yttrium rich YBCO powders at a temperature of about 1400° C., followed by rapid splat quenching, crushing the quenched powder, pelletizing and directional recrystallization of the pellet to form a superconductor with more than 75% of a $YBa_2Cu_3O_x$ phase free from a $Y_2BaCuO_5$.

An object of the present invention is to provide a process for producing a YBCO superconductor without first forming a Y-211 phase by heating calcined yttrium rich YBCO powders at about 1400° C. and directionally recrystallizing the heat treated powders at a temperature 100° below the peritectic temperature.

A further object of the present invention is the formation of superconductors with more than 75% of a $YBa_2Cu_3O_x$ phase free from $Y_2BaCuO_5$.

Another object of the present invention is to provide a process of producing a textured superconductor that is polycrystalline and contains grains which are oriented in a linear structure, without using a slow crystal growth process.

A further object of the present invention is the bulk texturing of the rapidly recrystallized $YBa_2Cu_3O_x$ grains.

These and other objects and advantages will be more apparent when considered with the following description and drawings that are provided to facilitate the understanding of the subject invention without any limitation thereto.

DETAILED DESCRIPTION OF THE PREFERRED EMBODIMENT

Figure 1A:
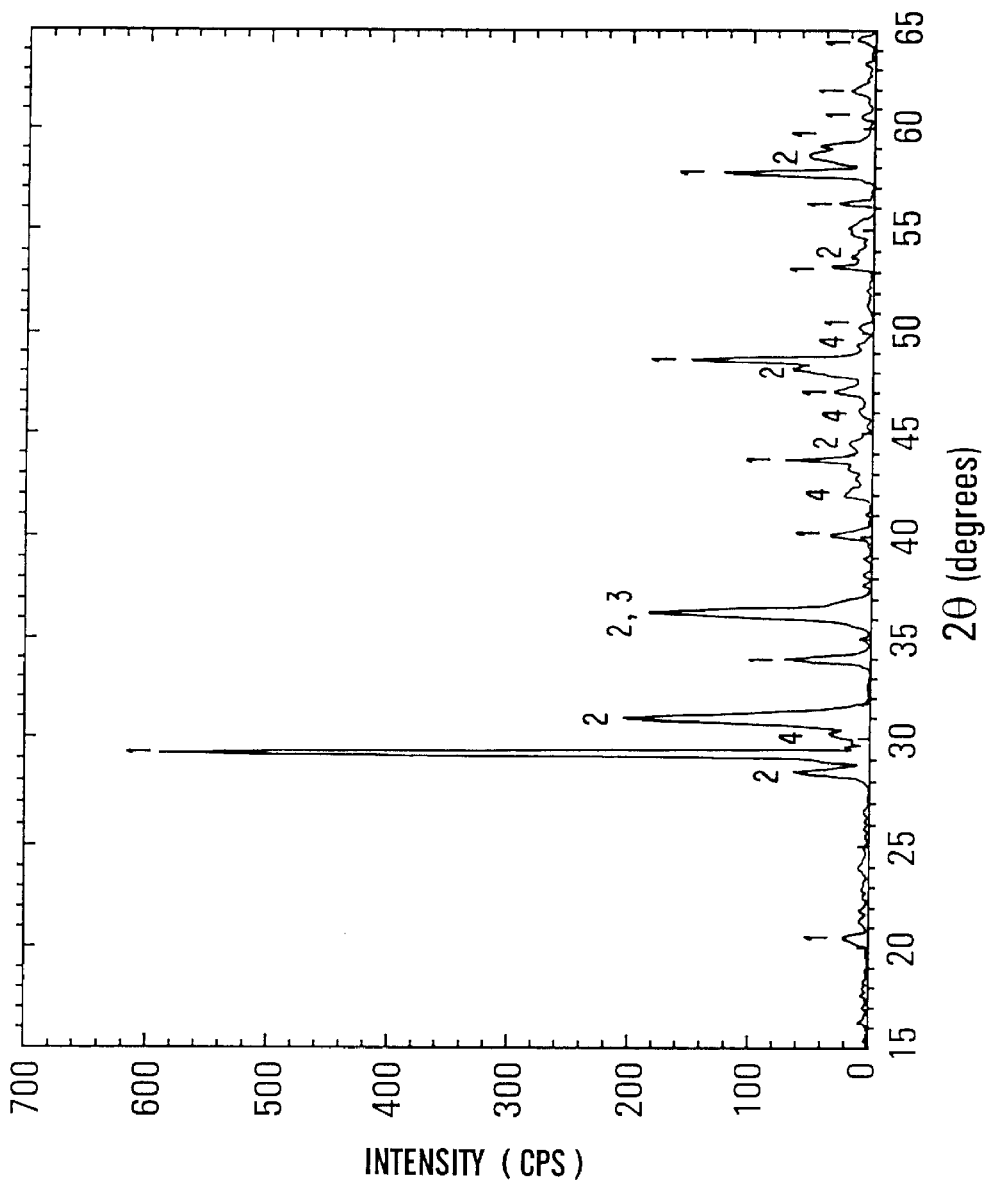
FIG. 1(a) Shows the X-ray powder diffraction pattern of a sample quenched from 1400° C. The main phases in the sample are $Y_2O_3(1)$, $BaCu_2O_2(2)$, $Cu_2O(3)$, and $BaCuO_2(4)$.

The present invention relates to a Y-123 composition that has been modified so as to be yttrium-rich. A high yttrium based composition was chosen so as to restrict the formation of Ba- and Cu-rich phases in the final material and to supersaturate the liquid phase at 1400° C. with yttrium.

The process of the present invention represents the first time the Y-123 superconductor has been prepared by an alternate route not involving the Y-211 phase. The Y-123 super-conducting phase can be formed rapidly, leading to introduction of texture without the disadvantage of slow crystal growth. The superconductors obtained according to the present invention are polycrystalline and contain grains which are oriented in a linear structure.

In the present invention the process is described as Quench and Directional Recrystallization (QDR) and involves recrystallization of $YBa_2Cu_3O_x$ from quenched precursors in a temperature gradient. The QDR process of the present invention differs from solidification methods such as melt-textured growth, liquid phase processing, quench and melt growth, melt-powder melt growth, powder melt processing and solid liquid melt growth, because the superconducting phase of the present inventions is formed by recrystallization (not by solidification) at rapid rates, but at temperatures about 100° C. below the peritectic temperature.

Generally the process of the present invention heats yttrium rich YBCO to about 1400° C., rapidly quenches the heated material and, after a crushing and compacting/pelletizing stage, heats the material to a temperature about 100° C. below the peritectic temperature. Conducting the process so that Y-211 as a precursor phase is avoided departs from conventional Y-123 processing. In a preferred embodiment, calcined powders of a starting composition $Y_{1-1.9}Ba_{1.8-2.5}Cu_{2.8-3.5}O_{6-7}$ where x is between 6 and 7, were heated at 1400° C., in platinum crucibles for a period of about 0.5–5 hours, and maintained at this temperature for 2 hours and then splat quenched between two copper plates.

By "splat" quenching is meant a cooling process where the melt is sandwiched between copper sheets. The resulting cake of splat-quenched material was crushed and sieved through a 400 mesh sieve and pressed into a pellet. It is preferable to use powders as opposed to bulk quenched materials as a starting material for the recrystallization process because of chemical homogeneity and the absence of microcracks allow long, slender rods. The use of bulk materials may lack the homogeneity of the powdered material and develop microcracks.

The quench and directional recrystallization process of the present invention textured bulk $YBa_2Cu_3O_x$ superconductors at temperatures about 100° C. below the peritectic temperature. A well-textured microstructure was achieved by directional recrystallization of the quenched compacts, e.g. a pellet, at a rate of 10 mm/h. The pellet was heat treated at a temperature in the range from 850° to 930° C., 165° C. to 85° C. below the peritectic temperature to form Y-123 free of the Y-211 phase. In a preferred embodiment, isothermal recrystallization of quenched precursors of the present invention is performed at 890° C., for 3 minutes is found to result in the formation of more than 75% of $YBa_2Cu_3O_x$ phase without any formation of $Y_2BaCuO_5$.

The magnetic field dependence of the critical density at 77° K of the subject directionally recrystallized material compares well with that of melt textured YBCO and is superior to that of magnetically aligned and sintered YBCO.

X-ray powder diffraction was conducted on the quenched powder of the present invention and the result shown in FIG. 1(a). As shown in FIG. 1(a), the phase assemblage of the quenched material is mainly $Y_2O_3$ and $BaCu_2O_2$. Traces of $Cu_2O$ and $BaCuO_2$ are also present. FIG. 1(a) shows that the quenched powder lacks either $YBa_2Cu_3O_x$ or $Y_2BaCuO_5$.

The recrystallization step is performed on quenched powder that was compacted in form of rectangular bars by uniaxial cold pressing at 100 MPa followed by isostatic cold pressing at 350 MPa. A maximum density of about 70% was achieved by this method. To form a compact with a sufficiently high density, and at the same time maintain the phase assemblage of the quenched material, a low temperature hot pressing process was performed. In this process, the quenched powder is filled in a steel die. A uniaxial pressure of 20–50 MPa is applied at room temperature. The die is heated to 400° C.–500° C. in an Argon atmosphere in 0.5–2 hours. The temperature is maintained for 10 minutes to 1 hour and then the sample is cooled to room temperature in 2 hours. The load is released during the cooling process or after the die reaches room temperature. The low temperature hot pressing procedure produced a compact with a density greater than 85% at temperatures as low as 400° C. in an argon atmosphere, for a period of about 10 minutes, at a pressure of about 40 MPa. X-ray powder diffraction of the hot-pressed compact showed hardly any $YBa_2Cu_3O_x$ and $Y_2BaCuO_5$. However, hot pressing at higher temperatures, such as, 500° C. resulted in formation of $YBa_2Cu_3O_x$ which increased substantially at 600° C.

Figure 1B:
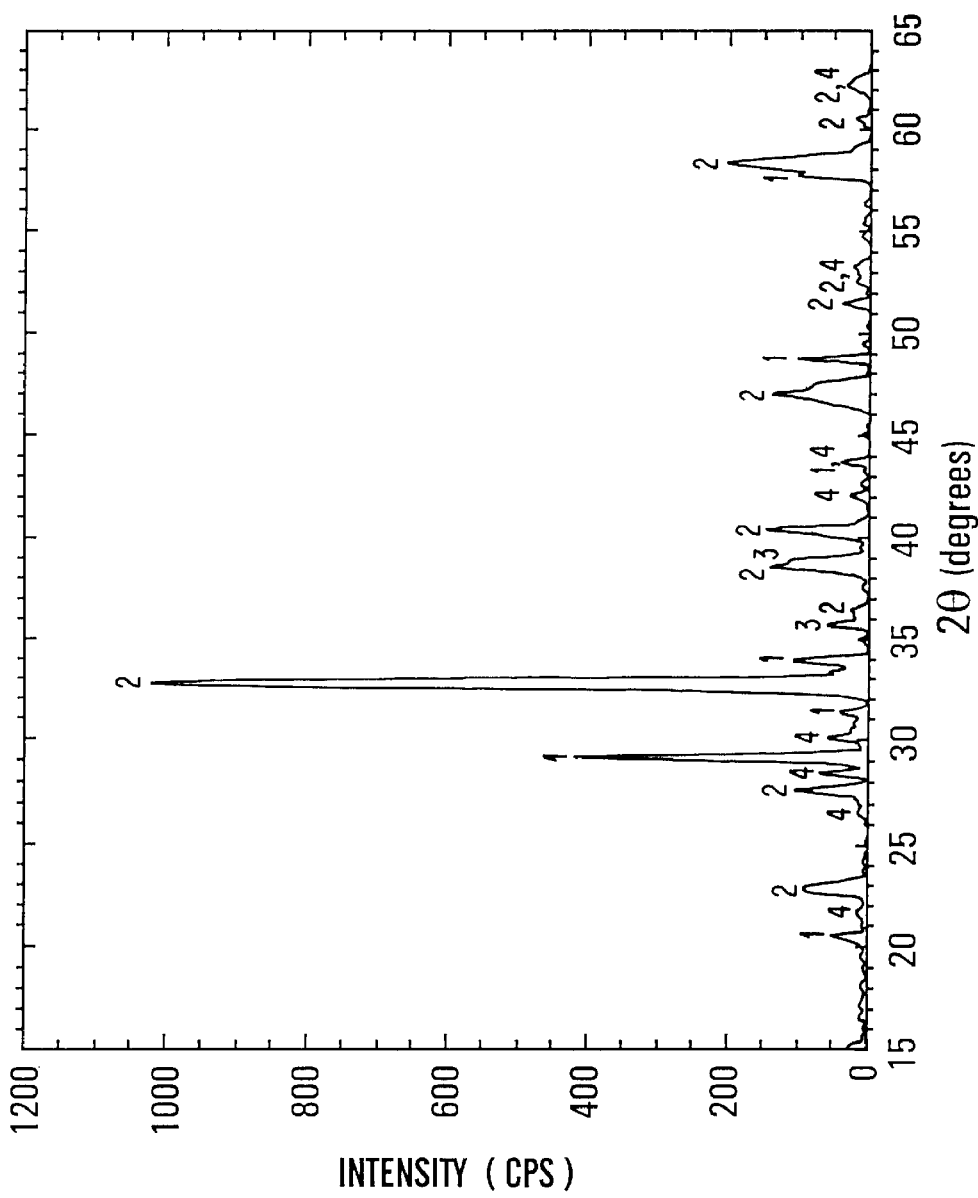
FIG. 1(b) Shows the X-ray powder diffraction of a quenched and hot-pressed sample isothermally recrystallized in air at 890° C. for 3 minutes. The phase assemblage in this sample contains $YBa_2Cu_3O_x(2)$, $Y_2O_3(1)$, $CuO(3)$, and $BaCuO_2(4)$. No $Y_2BaCuO_5$ is found.

According to the present invention, $YBa_2Cu_3O_x$ can be rapidly recrystallized from the quenched material at temperatures lower than the peritectic temperature. A small piece of the hot-pressed compact was rapidly inserted (heating rate of about 400° C./min) into an isothermal furnace preheated to 890° C. in air. After holding at this temperature for about 3 min., the compact was air quenched at room temperature. The X-ray powder diffraction pattern of this compact is shown in FIG. 1(b). FIG. 1(b) shows that over a period of three minutes of heating, a substantial amount of $YBa_2Cu_3O_x$ phase is formed. FIG. 1(b) also shows that all the major phases in the quenched material namely $Y_2O_3$, $BaCu_2O_2$ and $Cu_2O$ are depleted after the short heat treatment and that no $Y_2BaCuO_5$ is formed. In the present invention, the $YBa_2Cu_3O_x$ phase is not formed by the reaction between $Y_2BaCuO_5$ and the liquid phase as in the case of conventional melt-texturing processes. As a result, the factors that restrain the formation of $YBa_2Cu_3O_x$ in the solidification processes of the prior art should not be applicable in processing method of the present invention.

Figure 2:
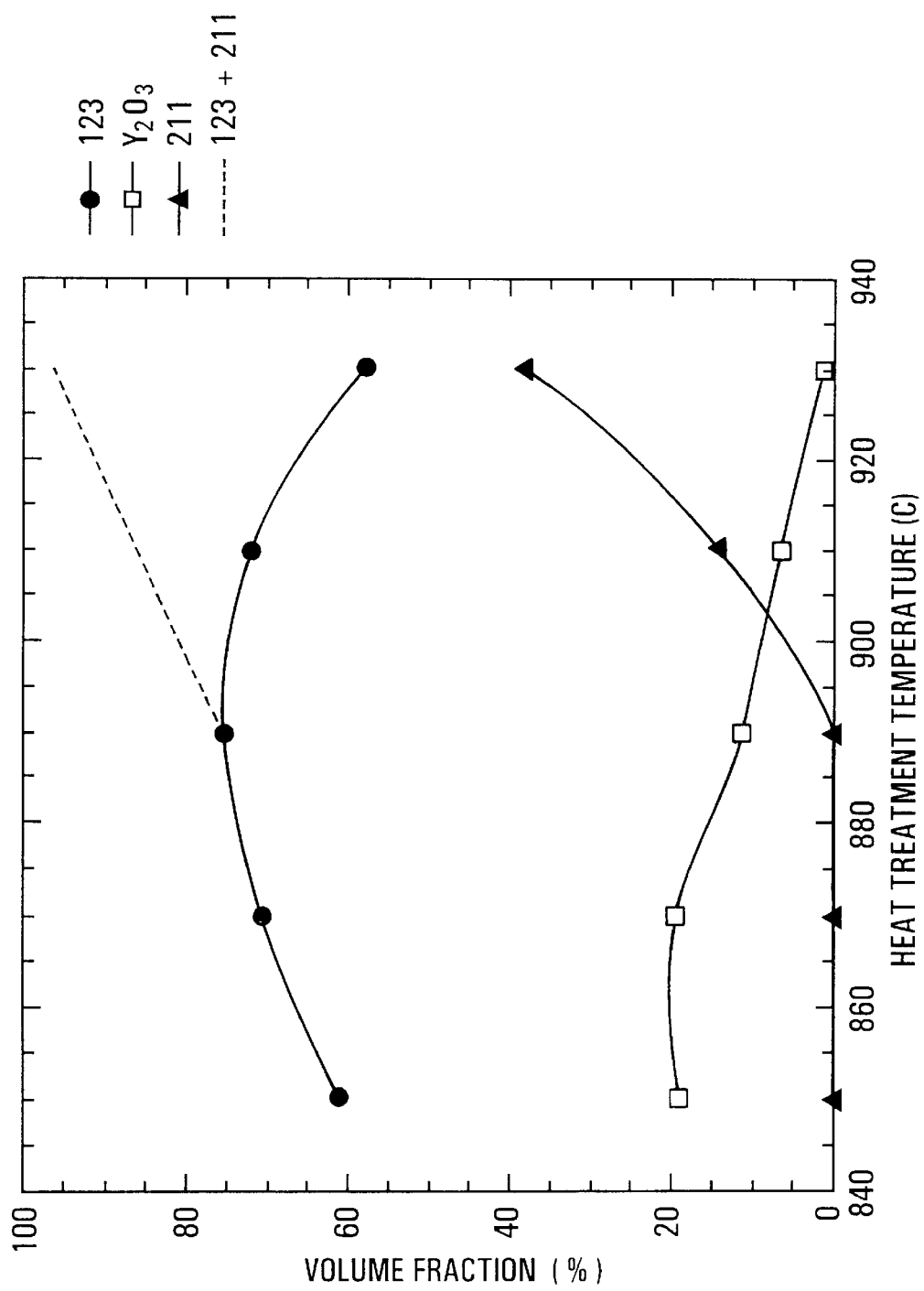
FIG. 2 Shows the volume fraction of $YBa_2Cu_3O_x$, $Y_2BaCuO_5$, and $Y_2O_3$ in samples isothermally recrystallized for a period of 3 minutes at various temperatures. $YBa_2Cu_3O_x$ forms rapidly and $Y_2O_3$ becomes depleted in the short heat treatment. $Y_2BaCuO_5$ is absent until 910° C. beyond which it forms rapidly as fine precipitates.

The $YBa_2Cu_3O_x$ is directionally recrystallized in a temperature gradient to attain a textured microstructure. Recrystallization of the $YBa_2Cu_3O_x$ phase was evaluated by preparing five pieces cut from a hot pressed compact described above and subjected to the same heat-treatment as the sample in FIG. 1(b), but with temperatures ranging from 850° C. to 930° C. A preferred temperature ranges from 850° C. to 910° C. X-ray powder diffraction was conducted on the five heat treated samples and the relative amounts of $Y_2O_3$, $YBa_2Cu_3O_x$, and $Y_2BaCuO_5$ were calculated. The volume fractions of these phases were calculated using the integrated intensity of the $Y_2O_3$ peak at $2\theta=57.7°$, the $YBa_2Cu_3O_x$ peak at $2\theta=32.7°$ and the $Y_2BaCuO_5$ peak at $2\theta=31.4°$. These peaks suffered the least overlap from any peaks of the other phases in the material with the comparative results being shown in FIG. 2. The $BaCuO_2$ and $CuO$ phases are also present in the recrystallized material and their volume fractions were included in the calculations but are not shown in FIG. 2 for the sake of clarity. As in the case of the result shown in FIG. 1(b), FIG. 2 reveals that the formation of $YBa_2Cu_3O_x$ in the quenched and hot-pressed compact is rapid at all temperatures. It can be seen from FIG. 2 that more than 60% of the superconducting phase is formed at 850° C. in a period of 3 minutes which increases to a maximum of 76% at 890° C. The fraction of $Y_2O_3$ decreased from about 40% in the quenched and hot-pressed compact to 19% after recrystallization at 850° C. and to 1% at 930° C. FIG. 2 also shows that there is no formation of $Y_2BaCuO_5$ until 910° C., beyond which it forms rapidly amounting to 38% of the total volume at 930° C. As a result of the formation of $Y_2BaCuO_5$ at high temperatures, the relative amount of $YBa_2Cu_3O_x$ decreases beyond 890° C., but as shown in FIG. 2, the conversion of the phases in the quenched precursor to $YBa_2Cu_3O_x+Y_2BaCuO_5$ continues to increase, reaching almost 100% at 930° C. Although the largest fraction of $YBa_2Cu_3O_x$ was formed at 890° C. in a period of 3 minutes, the amount of Ba- and Cu-rich phases decreased substantially from 890° C. to 930° C.

Directional recrystallization was also conducted in a traveling heater system. The entry temperature gradient (as the sample enters the hot zone) was 130° C./cm and the exit temperature gradient (as the sample exits the hot zone) was 225C/cm. The length of the hot zone was defined by the distance between the locations were the temperature is 10° C. below the peak temperature, on entry and exit sides. For a peak temperature of 940° C., the hot zone length (distance between locations of 930° C.) was about 5 mm. Samples of 20 mm×2 mm×2 mm were cut from the quenched and hot pressed compact for the directional recrystallization process. The hot zone was moved over the sample at a rate of 10 mm/h.

Figure 3:
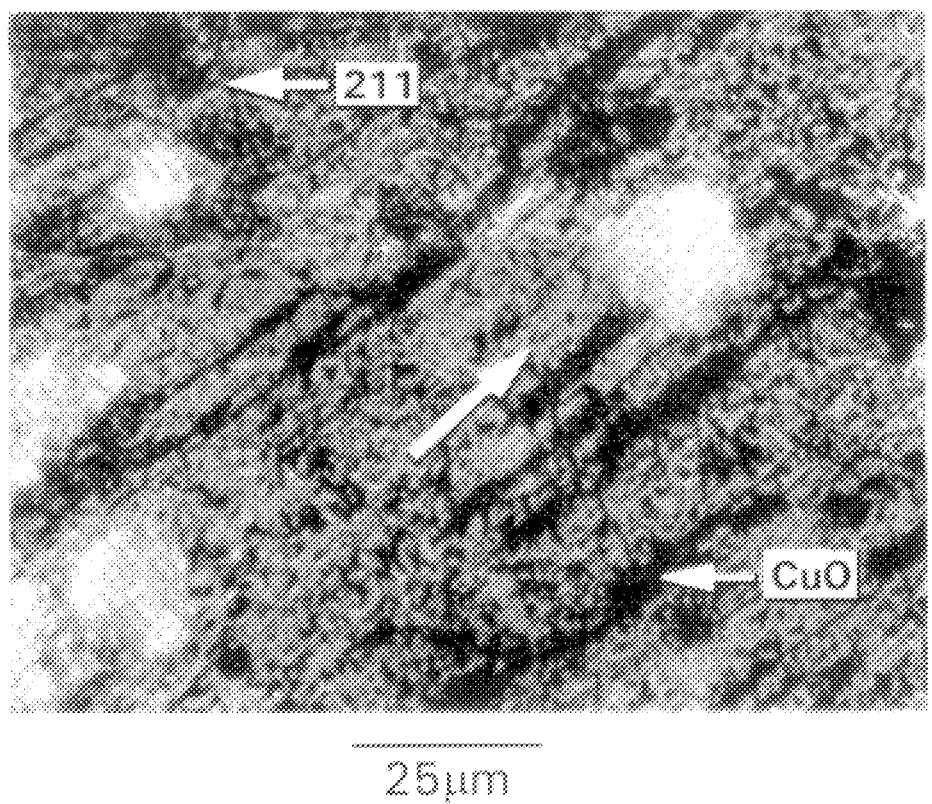
FIG. 3 Shows the microstructure of a directionally recrystallized sample grown at 10 mm/h observed under cross-polarized light. The microstructure has $YBa_2Cu_3O_x$ grains textured over 15 mm (matrix phase), elongated CuO grains (dark phase) and fine $Y_2BaCuO_5$ precipitates. The arrow indicates the direction of grain orientation.

FIG. 3 exhibits the microstructure of a directionally recrystallized sample observed under cross-polarized light. The microstructure consists of well-textured grains of $YBa_2Cu_3O_x$ and CuO aligned parallel to each other and oriented along the length of the sample. The spread in the orientation along the length of the sample, measured optically, was about 15° resulting in several domains of grains. The textured area was found to extend over 15 mm and is representative of the microstructure in the interior of the sample since a thickness of about 0.5 mm from the surface was removed during the lapping process. FIG. 3 also shows a large number of fine $Y_2BaCuO_5$ precipitates distributed throughout the matrix. These fine precipitates are similar to those observed in platinum-doped melt-textured samples. X-ray powder diffraction analysis of the sample revealed $YBa_2Cu_3O_x$ and CuO to be the major phases in the sample and indicated an absence of $Y_2O_3$. This finding is in agreement with the results obtained from isothermal recrystallization experiments. The large bright areas in FIG. 3 represent the pores in the sample. The sample was found to elongate by about 10% after the recrystallization process resulting in a density lower than that of the starting hot pressed compact.

Samples 10 mm in length and 0.5 $mm^2$ in cross-section were prepared from the textured superconductor by dry polishing on alumina films for transport current density current density measurements at 77 K. The magnetic field dependence of $J_c$ was investigated up to 1 T with the field oriented perpendicular to the long axis of the sample (direction of transport current). The dependence of $J_c$ on the relative orientation between the magnetic field and the sample was examined by rotating the sample about its long axis with respect to the magnetic field. The $J_c$ values do not appear to be influenced by the relative orientation between the magnetic field and the sample axis especially at fields above 0.5 T, which could be due to the spread in the c-axis of the grains. A voltage criterion of 1 $\mu V/cm$ was used to define the critical current density. At zero applied field, the sample was found to sustain currents up to 12.5 A which corresponds to a $J_c$ of 2500 $A/cm^2$.

Figure 4:
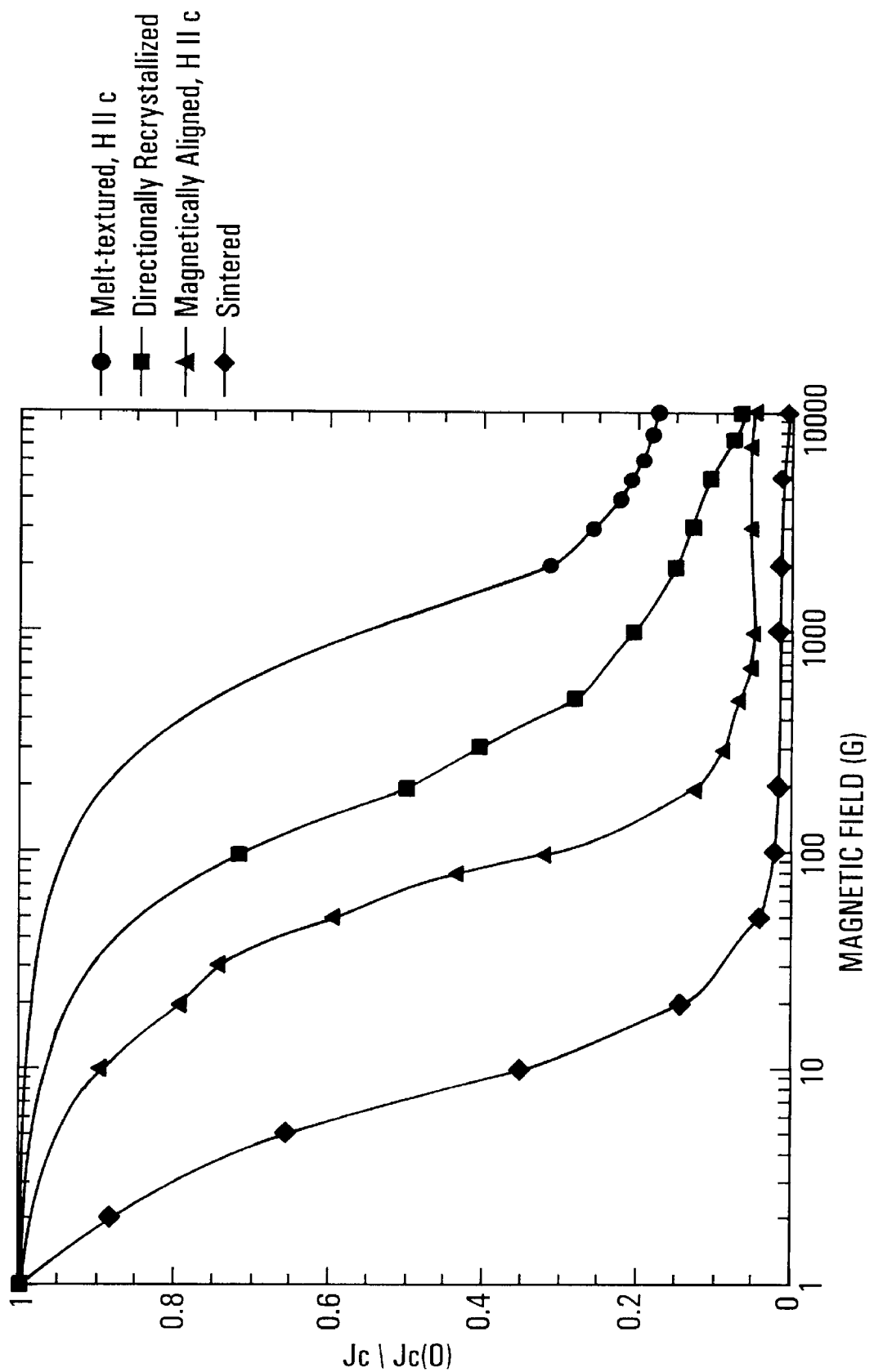
FIG. 4 Is a graph showing the comparison of the magnetic field dependence of transport critical current density at 77° K of directionally recrystallized YBCO ($J_c(0)$=2500 A/cm$^2$), high quality melt-textured YBCO, $J_c(0)$=75000 A/cm$^2$), magnetically aligned YBCO, $J_c(0)$=1000 A/cm$^2$ and randomly oriented sintered YBCO, $J_c(0)$=200 A/cm$^2$) normalized to their respective zero field values.

The field dependence of the transport current density of the sample at 77° K is shown in FIG. 4, with the $J_c$ values normalized with respect to the zero field value. The field dependencies of $J_c$ of a high quality melt-texture YBCO, the best magnetically aligned YBCO, and sintered YBCO are also included in the FIG. 4 for comparison. From FIG. 4, it can be seen that the field dependence of $J_c$ of the directionally recrystallized sample compares well with that of the melt-textured material and is superior to that of the magnetically aligned and sintered samples. For example, at a field of 100 G, the $J_c$ of the directionally recrystallized sample of the present invention is a factor of 1.4 lower than its zero field value which compares with 1.05 for melt-textured material, 3 for magnetically aligned sample and 50 for sintered YBCO.

The zero field $J_c$ of the directionally recrystallized material is about a factor of 10 lower than that of melt-textured materials measured over a length of a few centimeters. However, the $J_c$ of the directionally recrystallized material was measured over at least 10 domains (based on a maximum domain size of 500 μm and voltage lead spacing of 5 mm) with an overall spread in the orientation of 15° whereas the $J_c$ of the melt-textured material was obtained on essentially single-domain samples. Furthermore, melt-textured materials of the prior art have to be processed at a rate of from 1 to 2 mm/h in order to maintain a steady growth of the solidification interface which is 5 to 10 times lower than the recrystallization rate used in the present invention. The rate of 10 mm/h used in the present invention corresponds to a heating rate of 2° C./min and a dwell time of 30 min at temperatures in the vicinity of 930° C.

The results in FIG. 1(b) and FIG. 2 show that $YBa_2Cu_3O_x$ phase forms rapidly even at a heating rate of 400° C./min and a dwell time of 3 min, i.e., a growth rate of 100 mm/h (corresponding to a heating rate of 20° C./min and a dwell time of 3 min in the present furnace configuration) and provides a feasible directional recrystallization process. Furthermore, with isothermal recrystallization a rapid heating rate attains a higher fraction of superconducting phase and lesser Ba- and Cu-rich phases. The presence of a significant amount of CuO in the directionally recrystallized sample (FIG. 3) is believed to be in part due to the relatively low recrystallization rate used and could be eliminated by employing higher rates. Since the CuO grains shown in FIG. 3 are parallel to the direction of alignment of the $YBa_2Cu_3O_x$ grains and oriented along the length of the sample, they should not significantly affect the current carrying behavior.

Temperatures employed in the present invention are about 100° C. lower than the peritectic temperature. Therefore substrates and jacket materials that are compatible with YBCO, but cannot be used in melt-texturing processes, can be used in the present process. In such a case, thick film and even powder-in-tube processes could fabricate textured YBCO.

In addition to $YBa_2Cu_3O_x$, the $Y_2BaCuO_5$ phase also forms as fine precipitates at a rapid rate during the crystallization process at temperatures above 910° C. Since the dwell time is short and the temperatures are low in the present invention, coarsening of these precipitates which is a common phenomenon in melt-texturing, can be avoided and result in improved flux pinning. Since the magnetic field dependence of the textured YBCO compares well with that of the melt-textured materials, the quench and directionally recrystallization process provides a viable alternative for conductor fabrication.

The present invention can be used to produce directional recrystallization of powder-in-tube tapes or thick films made with quenched precursors. For instance, the quenched precursor can be packed in a silver (or alloy) tube, drawn and rolled to form a tape. Also, the quenched precursor can be deposited on a silver alloy substrate. The tape or the thick film can be then directionally recrystallized.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A process for producing a YBCO superconductor without forming a Y-211 precursor phase comprising: heat-treating yttrium rich precursor powders at a temperature of about 1400° C., rapidly cooling the heat-treated material, pelletizing the cooled material to form yttrium rich YBCO powders, and subsequently directionally recrystallizing the heat-treated yttrium rich YBCO powders at a temperature of about 100° below the peritectic temperature to form a superconductor with more than 75% of a $YBa_2Cu_3O_x$ phase free from $Y_2BaCuO_5$.

2. A process for producing a YBCO superconductor comprising:

a) heating calcined yttrium rich YBCO powders at about 1400° C.;

b) splat quenching the heated powder;

c) crushing the quenched powder; and d) directionally recrystallizing the crushed powder at a temperature of about 100° below the peritectic temperature to form a superconductor with more than 75% of a $YBa_2Cu_3O_x$ phase free from a $Y_2Ba_2CuO_5$, whereby the formation of a Y-211 precursor phase is avoided.

3. A process according to claim 2, wherein said directional recrystallization occurs at a rate of about 10–100 mm/hour.

4. A process according to claim 2, wherein said directional recrystallization is conducted at a temperature in the range of about 850° to 930° C., which temperature range is about 165° C. to 85° C. below the peritectic temperature.

5. A process according to claim 4, wherein said recrystallization is isothermal recrystallization and the quenched powders are heated at a temperature of about 890° C. for about 3 minutes.

6. A process according to claim 2, wherein said calcined yttrium rich YBaCuO powders is defined by the formula $Y_{1-1.9}Ba_{1.8-2.5}Cu_{2.8-3.5}O_x$, where x is between 6 and 7.

7. A process according to claim 2, wherein said yttrium rich YBCO powders are heated in a platinum crucible for a period of about 2 hours.

8. A process according to claim 2, wherein said quenching is splat quenching between two copper plates.

9. A process of producing a YCBO 123 superconductor comprising:

a) providing and heating an yttrium rich YBCO composition at a temperature of about 1400° C. to restrict the formation of Ba- and Cu-rich phases in the final material and to supersaturate the liquid phase at 1400° C. with yttrium;

b) rapidly quenching the heated material of step a); and c) directionally recrystallizing the product of step b) at a temperature of about 100° below the peritectic to form a textured YBCO 123 superconductor.

10. A process according to claim 9, wherein said directional recrystallization occurs at a rate of about 10–100 mm/hour.

11. A process according to claim 9, wherein said quenched composition is crushed and pelletized prior to recrystallization.

12. A process according to claim 11, wherein said directional recrystallization is conducted at a temperature in the range of about 850° to 930° C., which range is about 100° below the peritectic temperature.

13. A process according to claim 12, wherein said recrystallization is isothermal recrystallization and the quenched composition is heated at a temperature of about 890° C. for about 3 minutes.

14. A process according to claim 11, wherein said yttrium rich YBCO composition is heated in a platinum crucibles for a period of about 2 hours, and maintained at this temperature for about 2 hours.

15. A process according to claim 11, wherein said quenching is splat quenching between two copper plates.

16. A process according to claim 9, wherein said yttrium rich material is $Y_{1.9}Ba_{2.2}Cu_{3.2}O_x$ where x is between 6 and 7.

17. A process according to claim 4, wherein said recrystallization temperature is in a range of about 850° C. to about 910° C.

18. A process according to claim 17, wherein said recrystallization temperature is between 890° C. and 910° C.

19. A process according to claim 9, wherein the directional recrystallization is performed by a process selected from the group consisting of a temperature gradient, hot pressing and hot rolling.

* * * * *